(12) United States Patent
Fukuda

(10) Patent No.: US 12,002,730 B2
(45) Date of Patent: Jun. 4, 2024

(54) SEMICONDUCTOR MODULE

(71) Applicant: Mitsubishi Electric Corporation, Tokyo (JP)

(72) Inventor: Ikumi Fukuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 214 days.

(21) Appl. No.: 17/503,990

(22) Filed: Oct. 18, 2021

(65) Prior Publication Data
US 2022/0208639 A1    Jun. 30, 2022

(30) Foreign Application Priority Data

Dec. 28, 2020  (JP) ................................. 2020-218508

(51) Int. Cl.
*H01L 23/367* (2006.01)
*H01L 23/00* (2006.01)
(Continued)

(52) U.S. Cl.
CPC .......... *H01L 23/3677* (2013.01); *H01L 23/13* (2013.01); *H01L 23/49827* (2013.01);
(Continued)

(58) Field of Classification Search
CPC ................ H01L 23/3677; H01L 23/13; H01L 23/49827; H01L 24/73; H01L 2224/32227;
(Continued)

(56) References Cited

U.S. PATENT DOCUMENTS

2014/0035658 A1* 2/2014 Usui ...................... H01L 24/34
327/512
2014/0210093 A1* 7/2014 Wang ................ H01L 23/49575
257/773
(Continued)

FOREIGN PATENT DOCUMENTS

JP     H10-041440 A    2/1998
JP     2002-280503 A   9/2002
(Continued)

OTHER PUBLICATIONS

JP 2013-120866 (Year: 2013).*
(Continued)

*Primary Examiner* — Patricia D Valenzuela
(74) *Attorney, Agent, or Firm* — Studebaker & Brackett PC

(57) ABSTRACT

A plurality of semiconductor chips, a module substrate on which the plurality of semiconductor chips are mounted, a heat sink on which the module substrate is mounted, and a filler filled between the module substrate and the heat sink are included, in which the module substrate includes a heat radiating plate, and an insulating substrate on which the plurality of semiconductor chips are mounted, the heat radiating plate has a plurality of recess portions provided on a surface facing the heat sink and at least one groove, the plurality of recess portions are provided in regions corresponding to below arrangement regions of the plurality of semiconductor chips, the at least one groove is provided in a region corresponding to below a region between at least one of the plurality of semiconductor chips and an adjacent other semiconductor chip, and the filler also is filled in the plurality of recess portions.

8 Claims, 10 Drawing Sheets

(51) Int. Cl.
  *H01L 23/13* (2006.01)
  *H01L 23/498* (2006.01)
  *H01L 23/495* (2006.01)

(52) U.S. Cl.
  CPC ........ *H01L 24/73* (2013.01); *H01L 23/49537* (2013.01); *H01L 23/49575* (2013.01); *H01L 2224/32227* (2013.01); *H01L 2224/48227* (2013.01)

(58) Field of Classification Search
  CPC .......... H01L 2224/48227; H01L 24/29; H01L 24/32; H01L 24/45; H01L 24/48; H01L 24/49; H01L 24/83; H01L 2224/29101; H01L 2224/32225; H01L 2224/45124; H01L 2224/48091; H01L 2224/48137; H01L 2224/49175; H01L 2224/73265; H01L 2224/83801; H01L 2924/13055; H01L 2924/13091; H01L 2924/15156; H01L 23/34; H01L 23/36; H01L 25/072; H01L 23/3735; H01L 23/3672; H01L 23/3737; H01L 23/49537; H01L 23/49575
  See application file for complete search history.

(56) References Cited

U.S. PATENT DOCUMENTS

2017/0077009 A1    3/2017  Saito et al.
2019/0350078 A1*  11/2019  Wakabayashi ......... B22D 19/02

FOREIGN PATENT DOCUMENTS

| JP | 2013-120866 A | 6/2013 |
| JP | 2016-115782 A | 6/2016 |
| JP | 2017-059677 A | 3/2017 |
| JP | 2020-178105 A | 10/2020 |

OTHER PUBLICATIONS

An Office Action mailed by the Japanese Patent Office dated Oct. 3, 2023, which corresponds to Japanese Patent Application No. 2020-218508 and is related to U.S. Appl. No. 17/503,990; with English language translation.

An Office Action issued by the German Patent and Trademark Office on Feb. 21, 2024, which corresponds to German Patent Application No. 102021132407.6 and is related to U.S. Appl. No. 17/503,990; with English language translation.

* cited by examiner

SEMICONDUCTOR MODULE

BACKGROUND OF THE INVENTION

Field of the Invention

The present disclosure relates to a semiconductor module, and more particularly to a semiconductor module in which a decrease in heat radiation property is suppressed.

Description of the Background Art

In order to improve the heat radiation property of a semiconductor module, Japanese Patent Application Laid-Open No. 2013-120866 discloses a configuration in which, innumerable small honeycomb-shaped holes are provided in the heat radiation plane of a semiconductor chip to capture voids generated in a filler between a heat radiating plate and a heat sink, thereby suppressing heat transfer from the semiconductor chip to the heat sink from being blocked and maintaining heat radiation property of the semiconductor module.

SUMMARY

As in Japanese Patent Application Laid-Open No. 2013-120866, the time during which favorable heat radiation property is maintained is limited simply by providing small honeycomb-shaped holes in the heat radiating plane of the semiconductor chip to capture voids, and given the operating time for the actual use of the semiconductor module, there has been a problem that a sufficient effect cannot be obtained from the viewpoint of maintaining heat radiation property.

An Object is to provide a semiconductor module capable of suppressing deterioration of heat radiation property due to aging and maintaining heat radiation property.

According to the present disclosure, the semiconductor module includes a plurality of semiconductor chips, a module substrate on which the plurality of semiconductor chips are mounted, a heat sink on which the module substrate is mounted, and a filler filled between the module substrate and the heat sink, in which the module substrate includes a heat radiating plate, and an insulating substrate provided on the heat radiating plate and on which the plurality of semiconductor chips are mounted, the heat radiating plate has a plurality of recess portions provided on a surface facing the heat sink and at least one groove, the plurality of recess portions are provided in regions corresponding to below arrangement regions of the plurality of semiconductor chips, the at least one groove is provided in a region corresponding to below a region between at least one of the plurality of semiconductor chips and an adjacent other semiconductor chip, and the filler also is filled in the plurality of recess portions.

According to the above semiconductor module, a plurality of recess portions are provided on the surface facing the heat sink of the heat radiating plate, and the plurality of recess portions are also filled with a filler; therefore, when pumping out occurs due to thermal deformation of the heat radiation plate, the filler filled in the plurality of recess portions is extruded to the surface facing the heat sink, so that the filler is replenished and the deterioration of the heat radiation property of the semiconductor module can be suppressed. Further, by providing at least one groove, thermal interference due to heat generation between adjacent semiconductor chips can be alleviated, and the maximum temperature of the entire semiconductor module can be lowered to suppress the occurrence of pumping out.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
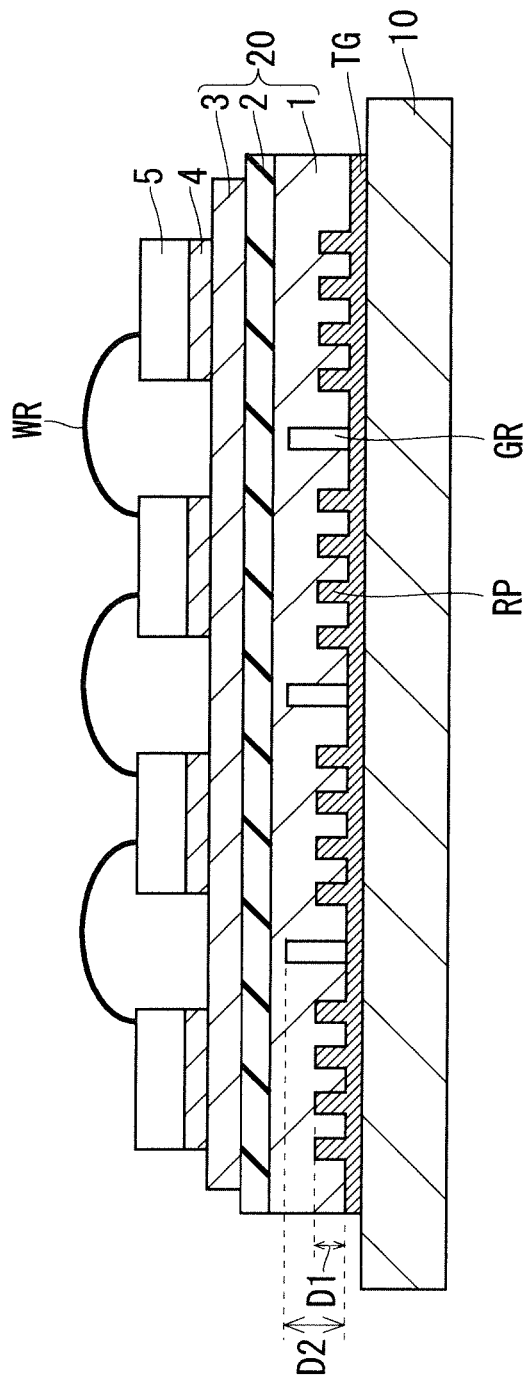
FIG. 1 is a cross-sectional view illustrating a configuration of a main part of a semiconductor module according to Embodiment 1.

FIG. 1 is a cross-sectional view illustrating a configuration of a main part of a semiconductor module 100 according to Embodiment 1. As illustrated in FIG. 1, in the semiconductor module 100, the insulating substrate 2 is bonded to the upper surface of the heat radiating plate 1 with a bonding material (not illustrated) such as a solder material or an adhesive. A circuit pattern 3 is provided on the upper surface of the insulating substrate 2, and a plurality of semiconductor chips 5 such as transistor chips for electric power and diode chips for electric power are bonded on the circuit pattern 3 via a bonding material 4 such as a solder material. A laminated structure of the heat radiating plate 1, the insulating substrate 2, and the circuit pattern 3 is conveniently referred to as a module substrate 20.

The insulating substrate 2 is made of a resin or a ceramic material, and the heat radiating plate 1 is made of a material having excellent heat radiation property such as aluminum (Al) or copper (Cu).

As illustrated in FIG. 1, the semiconductor module 100 has a heat sink 10 arranged on the lower surface side of the heat radiating plate 1, and thermal grease TG such as silicon grease, that is, a filler is filled between the lower surface of the heat radiating plate 1 and the upper surface of the heat sink 10. Although the semiconductor module 100 is housed in a case made of resin or the like and sealed with a resin or the like, the illustration thereof will be omitted in the following description.

The circuit pattern 3 is composed of a conductor such as Al or Cu, and is formed by metallizing the surface of the insulating substrate 2.

In FIG. 1, the main electrodes on the upper surface side of the plurality of semiconductor chips 5 are connected to each other by wire bonding via wires WR of Al, and FIG. 1 represents only one cross section of the semiconductor module 100. In another cross section of the semiconductor module 100, there is also a portion where the main electrode on the upper surface side of the semiconductor chip 5 and the circuit pattern 3 are connected via the wire WR.

As illustrated in FIG. 1, a plurality of recess portions RP and a plurality of grooves GR are provided on the lower surface of the heat radiating plate 1. The recess portions RP are provided so as to be substantially uniformly distributed in the regions corresponding to below the arrangement regions of the semiconductor chips 5 of the radiating plate 1, and the grooves GR are provided in the regions corresponding to below the regions between the semiconductor chips 5. Both the recess portions RP and the grooves GR are provided so as to extend from the outermost surface of the lower surface of the heat radiating plate 1 in the thickness direction of the heat radiating plate 1, and both are provided at a depth that does not extend through the heat radiating plate 1. Further, the depth D1 of the recess portions RP is set, for example, to about 300 μm at the maximum value.

The grooves GR are provided to prevent thermal interference between the semiconductor chips 5 generating heat, and the depth D2 of the grooves GR is formed to be deeper than the depth D1 of the recess portions RP. That is, making the depth D2 of the grooves GR as deep as possible within a range where a ground fault or the like does not occur between the semiconductor chips 5 and the heat sink 10 suppresses thermal interference between the semiconductor chips 5.

Further, if the area of the recess portions RP is increased, there is a concern that the area contacting the heat radiating plate 1 and the area contacting the heat sink 10 will be biased. Therefore, it is desirable that the area of the recess portions RP are made as small as possible and the recess portions RP are uniformly arranged.

That is, if the area of the recess portions RP is too large, occurrence of temperature differences may occur between the semiconductor chips 5 due to variations in heat radiation property, when a plurality of semiconductor chips 5 are provided. Therefore, it is desirable that the area of the recess portions RP are made as small as possible in order to uniform heat radiation property.

The thermal conductivity from the heat radiating plate 1 to the heat sink 10 depends on the material, area, and shape of the heat radiating plate 1, and the thermal conductivity and viscosity of the grease change depending on the type of thermal grease TG to be used. Therefore, the area and placement density of the recess portions RP, in general, is difficult to specify. If specified in relation to the size of the mounted semiconductor chips 5, for example, the total area of the recess portions RP corresponding to one semiconductor chip 5 is set to 25% or less of the area of the semiconductor chip 5, and the total area of the plurality of recess portions RP and the plurality of the grooves GR is set to about 25% to 50% of the area of the heat radiating plate 1.

Here, the area of the recess portions RP represents the area perpendicular to the depth direction of the recess portions RP, that is, the opening area of the recess portions RP, and the area of the grooves GR represents the area perpendicular to the depth direction of the grooves GR, that is, the opening area of the grooves GR. For the shape of the recess portions RP in a plan view, a circular shape, or a polygonal such as a quadrangle, a pentagon, or a hexagon may also be adopted.

Figure 2:
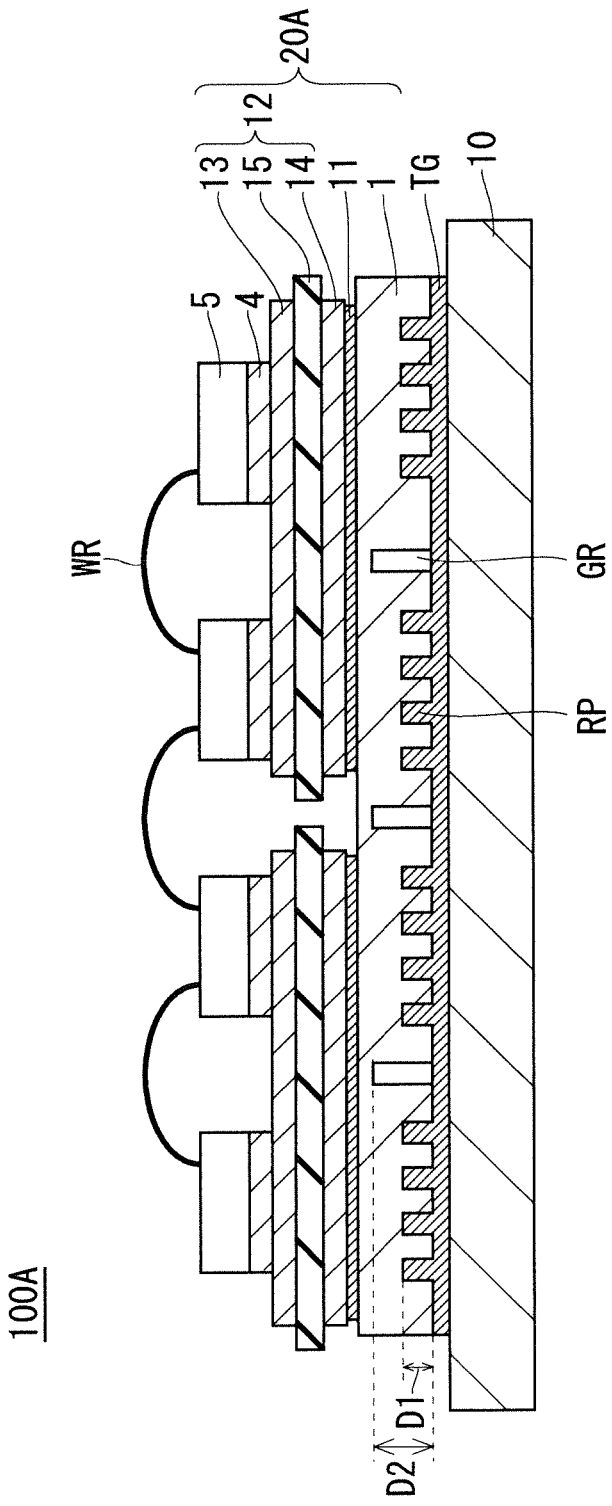
FIG. 2 is a cross-sectional view illustrating the configuration of the main part of the semiconductor module according to Embodiment 1.

The semiconductor module 100 illustrated in FIG. 1 illustrates a configuration in which the insulating substrate 2 is directly bonded to the upper surface of the radiating plate 1, while in FIG. 2, a semiconductor module 100A is illustrated in which a circuit pattern 13 is formed on the upper surface of a ceramic substrate 15 and an insulating substrate 12 on which a copper film 14 is formed on the lower surface thereof is bonded to the heat radiating plate 1 via a bonding material 11 such as a solder material. A laminated structure of the heat radiating plate 1, the bonding material 11, and the insulating substrate 12 is conveniently referred to as a module substrate 20A. In FIG. 2, the same components as those of the semiconductor module 100 described with reference to FIG. 1 are designated by the same reference numerals, and duplicate description will be omitted.

In FIG. 2, a plurality of module substrates 20A are mounted on the heat radiating plate 1, and a plurality of semiconductor chips 5 are bonded to each thereof.

Figure 3:
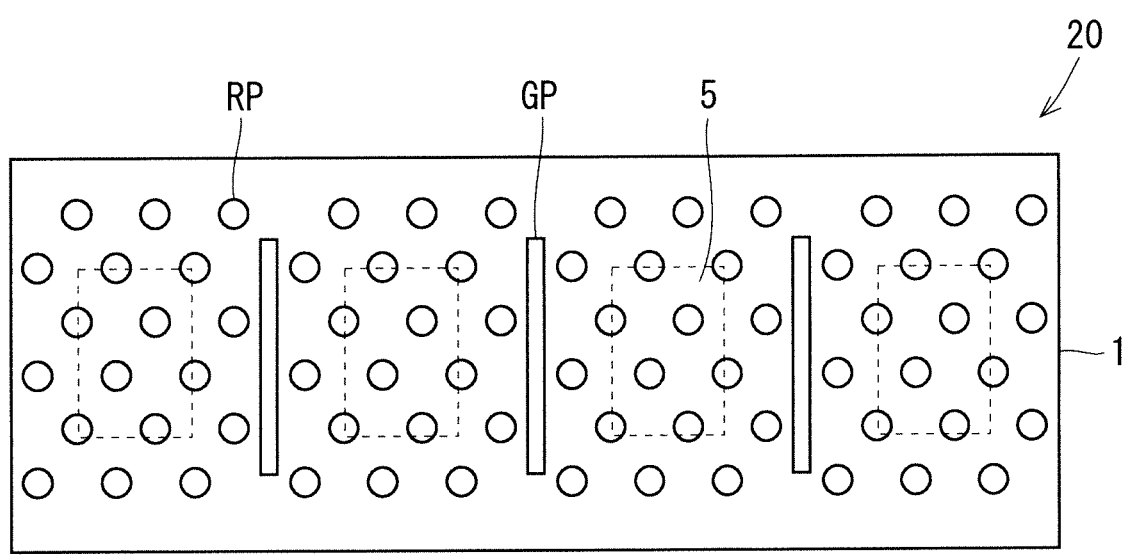
FIG. 3 is a plan view of a module substrate of the semiconductor module according to Embodiment 1 as viewed from the bottom surface.

FIG. 3 is a plan view of the module substrate 20A as viewed from the bottom surface. The plurality of recess portions RP are provided so as to be substantially uniformly distributed in the regions corresponding to below the arrangement regions of the semiconductor chips 5.

The grooves GR are provided in an elongated rectangular shape between the arrangement regions of the recess portions RP, and the length of the long side thereof is set to be longer than the long side of the rectangular semiconductor chip 5 in a plan view shape. The length of the short side of the groove GR is preferably the shortest possible length within the range the process can be machined and is set to, for example, about 0.1 mm.

A gap of about 0.05 mm is generated at the maximum between the semiconductor module 100 and the heat sink 10; therefore, thermal grease TG is filled so as to eliminate the gap. At that time, recess portions RP are also filled with the thermal grease TG. The grooves GR do not have to be filled with the thermal grease TG.

The effects of providing such recess portions RP are as follows. When the semiconductor module 100, especially the heat radiating plate 1, is thermally deformed due to the thermal cycle caused by the heat generated by the semiconductor chips 5, pumping out occurs in some cases in which the thermal grease TG filled in the gap between the heat radiating plate 1 and the heat sink 10 is pushed the outside.

When pumping out occurs, the amount of the filled thermal grease TG is reduced, a gap is created between the heat radiating plate 1 and the heat sink 10, lowering the heat radiation property of the semiconductor module 100.

However, by providing the recess portions RP and filling them with thermal grease TG, air flows into the recess portions RP when pumping out occurs, extruding the thermal grease TG filled in the recess portions RP to the surface the heat sink 10 faces, thereby replenishing the gap between the heat radiating plate 1 and the heat sink 10 with thermal grease TG. Therefore, the suppression of the decrease in heat radiation proper of the semiconductor module 100 is ensured.

Further, by providing the grooves GR, thermal interference due to heat generation of the semiconductor chips 5 can be alleviated between adjacent semiconductor chips 5, lowering the maximum temperature of the entire semiconductor module 100. As a result, the thermal stress is reduced, the amount of change in the warp of the heat radiating plate 1 is reduced, leading to the suppression of the occurrence of pumping out itself.

Embodiment 2

Figure 4:
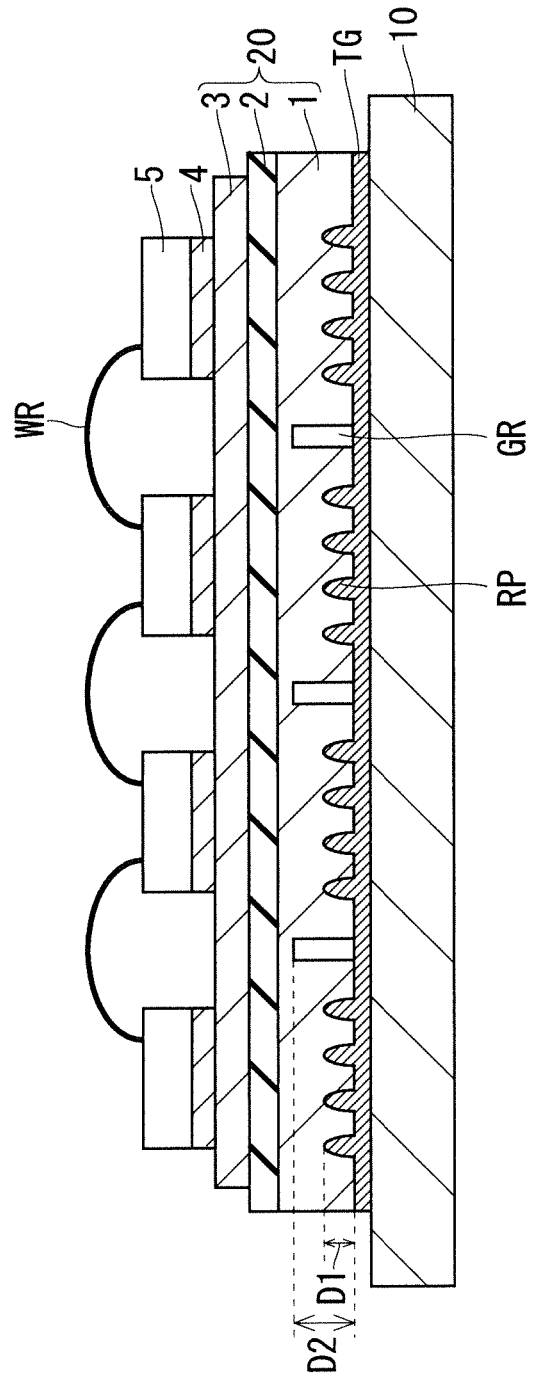
FIG. 4 is a cross-sectional view illustrating the configuration of the main part of the semiconductor module according to Embodiment 2.

FIG. 4 is a cross-sectional view illustrating a configuration of a main part of a semiconductor module 200 according to Embodiment 2. In FIG. 4, the same components as those of the semiconductor module 100 described with reference to FIG. 1 are designated by the same reference numerals, and duplicate description will be omitted.

As illustrated in FIG. 4, in the semiconductor module 200, the cross-sectional shape of the recess portions RP are dome-shaped. With this shape, the recess portions RP have no corners, so that the stress generated in the heat radiating plate 1 can be easily dissipated, and fatigue breakdown of the heat radiating plate 1 can be prevented.

The effect of suppressing the decrease in heat radiation property by providing the recess portions RP and the effect of alleviating thermal interference by providing the grooves GR are the same as those in Embodiment 1.

Embodiment 3

Figure 5:
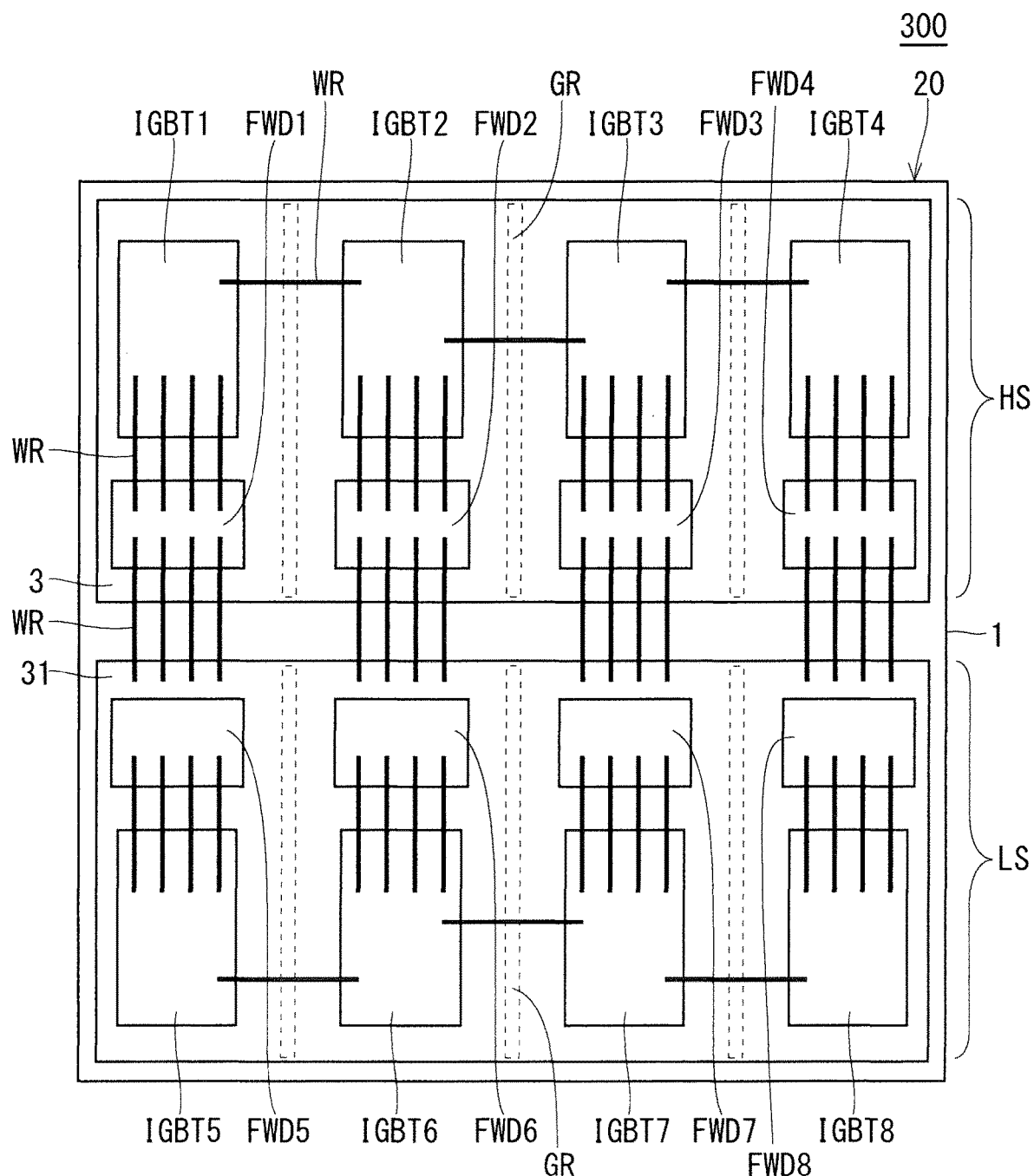
FIG. 5 is a plan view of a semiconductor module according to Embodiment 3 as viewed from the upper surface side.

FIG. 5 is a plan view of a semiconductor module 300 according to Embodiment 3 as viewed from the upper surface side, that is, the side on which semiconductor chips are arranged. In Embodiment 3, characteristics thereof lie in the arrangement of the grooves GR and the grooves GR are illustrated by broken lines, and the illustration of the recess portions RP is omitted.

The semiconductor module 300 illustrated in FIG. 5 has a high-side phase HS with a high potential and a low-side phase LS with a low potential, and has a two-phase semiconductor module configuration composed of a plurality of chip pairs in which each chip pair has an Insulated Gate Bipolar Transistor (IGBT) chip and a Free Wheeling Diode (FWD) chip which are connected in parallel in each of the high-side phase HS and the low-side phase LS. The plurality of chip pairs in the high-side phase HS are driven in parallel, and the plurality of chip pairs in the low-side phase LS are driven in parallel.

The configuration of the semiconductor module is not limited to two phases, and the present disclosure can be applied to a semiconductor module having only one phase, a semiconductor module having three phases, and a semiconductor module having six phases. Further, as the semiconductor chip, a semiconductor chip other than the IGBT chip and the diode chip can also be used. The present disclosure is also applicable to semiconductor modules driven in series.

As illustrated in FIG. 5, in the semiconductor module 300, the grooves GR are provided in the high-side phase HS and the low-side phase LS in the regions corresponding to below the regions between the pairs of the IGBT chips and the FWD chips of the heat radiating plate 1. The length of the long side of the groove GR is set longer than the length of the arrangement of the chip pair of the IGBT chip and the FWD chip.

Further, as illustrated in FIG. 5, the IGBTs 1 to 4 and the FWDs 1 to 4 in the high-side phase HS are mounted on the circuit pattern 3, and the IGBTs 5 to 8 and the FWD 5 to 8 in the low-side phase LS are mounted on the circuit pattern 31, and the anodes of the FWDs 1 to 4 of the high-side phase HS and the circuit pattern 31 of the low-side phase LS are joined by wires WR.

Figure 6:
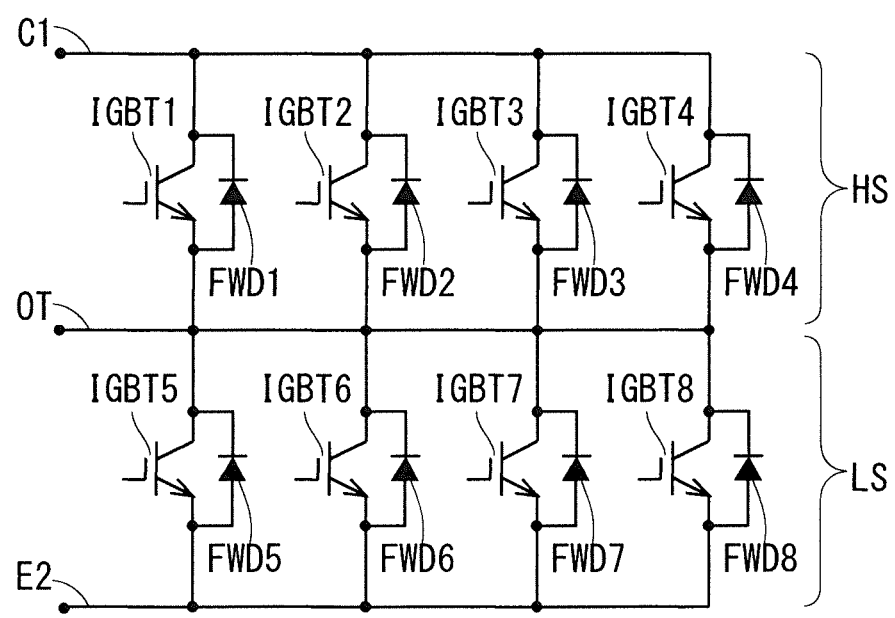
FIG. 6 is a circuit diagram illustrating a configuration of an inverter circuit mounted on the semiconductor module according to Embodiment 3.

FIG. 6 is a circuit diagram illustrating a configuration of a two-phase inverter circuit mounted on the semiconductor module 300 of FIG. 5. The inverter circuit illustrated in FIG. 6 has the IGBTs 1 to 4 as high-side semiconductor chips and the FWDs 1 to 4 connected in antiparallel to each of the IGBTs 1 to 4, and the IGBTs 5 to 8 as low-side semiconductor chips and the FWDs 5 to 8 connected in antiparallel to each of the IGBT 5 to 8.

The collectors of the IGBTs 1 to 4 are commonly connected to a power line Cl, the emitters of the IGBTs 5 to 8 are commonly connected to a power line E2, and the emitters of the IGBTs 1 to 4 and the collectors of the IGBTs 5 to 8 are commonly connected to an output line OT.

As illustrated in FIG. 5, by providing the grooves GR in the high-side phase HS and the low-side phase LS in the regions corresponding to below the regions between the pairs of the IGBT chips and the FWD chips of the heat radiating plate 1, thermal interference between chip pairs that generate heat at the same time can be alleviated, and the maximum temperature of the entire semiconductor module 300 can be lowered.

Further, by providing the grooves GR, the thermal stress is reduced by the reduction in the temperature difference in the semiconductor module 300 and this makes pumping out less likely to occur, the thermal grease TG is less replenished from the recess portions RP, making the thermal grease TG in the recess portions RP less likely to be depleted, thereby extending the time during which the thermal grease TG can be replenished from the recess portions RP.

Embodiment 4

Figure 7:
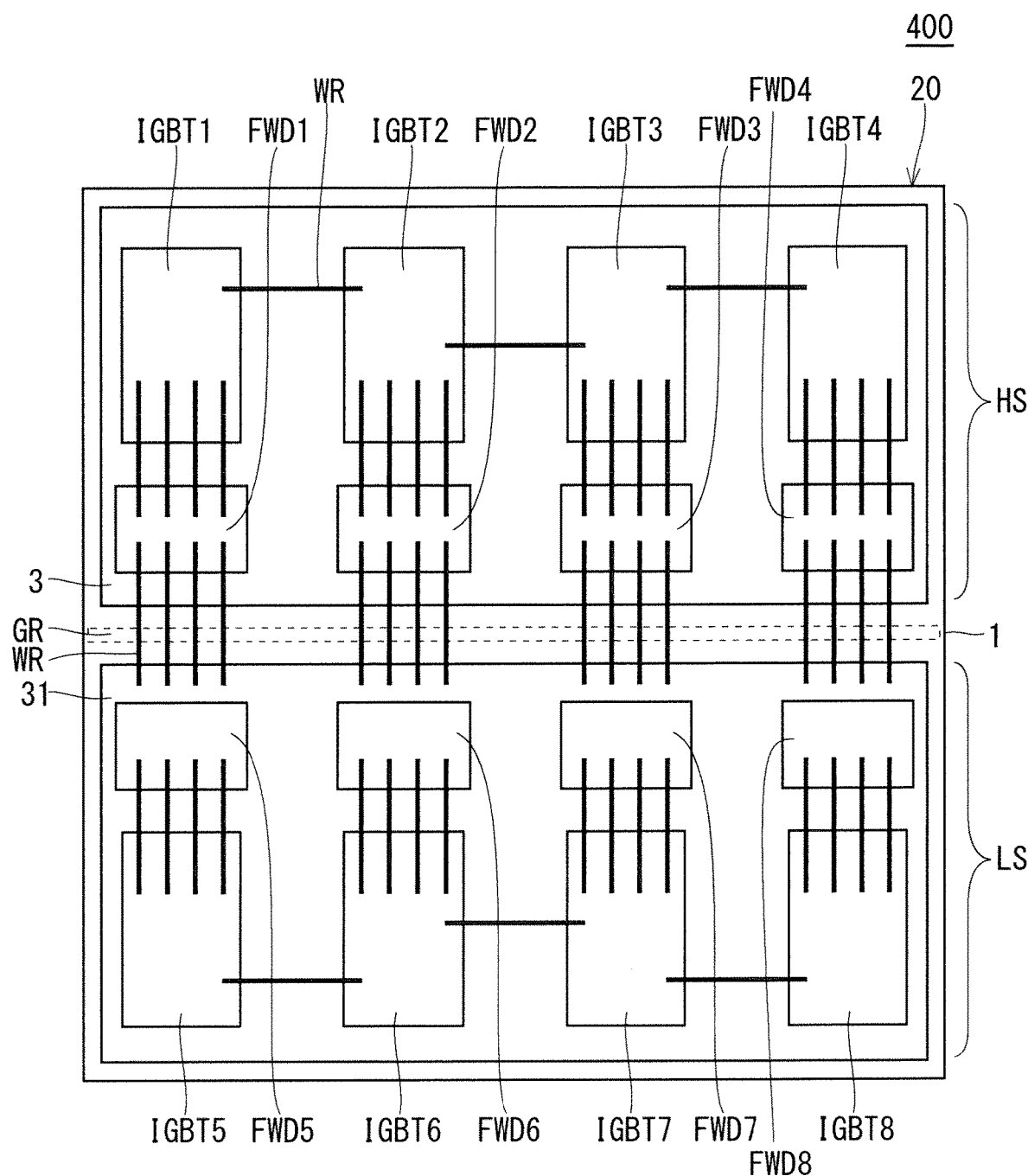
FIG. 7 is a plan view of a semiconductor module according to Embodiment 4 as viewed from the upper surface side.

FIG. 7 is a plan view of a semiconductor module 400 according to Embodiment 4 as viewed from the upper surface side, that is, the side on which semiconductor chips are arranged. In Embodiment 4, characteristics thereof lie in the arrangement of the groove GR and the groove GR is illustrated by broken lines, and the illustration of the recess portions RP is omitted.

In the semiconductor module 400 illustrated in FIG. 7, a groove GR is provided along the long sides of the circuit patterns 3 and 31 in the region corresponding to below the region between the circuit pattern 3 of the high-side phase HS and the circuit pattern 31 of the low-side phase LS of the heat radiating plate 1. That is, a groove GR is provided along the arrangement of a first chip group and a second chip group in the region corresponding to below the region between the first chip group and the second chip group that operate complementarily.

By providing such a groove GR, thermal interference from one of the complementarily driven chip pairs of the high-side phase HS or the chip pairs of the low-side phase LS to the other phase is suppressed, and the number of the semiconductor chips to have the maximum temperature is reduced, thereby reducing the temperature difference in the semiconductor module 400. This reduces thermal stress and makes pumping out less likely to occur, the thermal grease TG is less replenished from the recess portions RP, making the thermal grease TG in the recess portions RP less likely to be depleted, thereby extending the time during which the thermal grease TG can be replenished from the recess portions RP.

Embodiment 5

Figure 8:
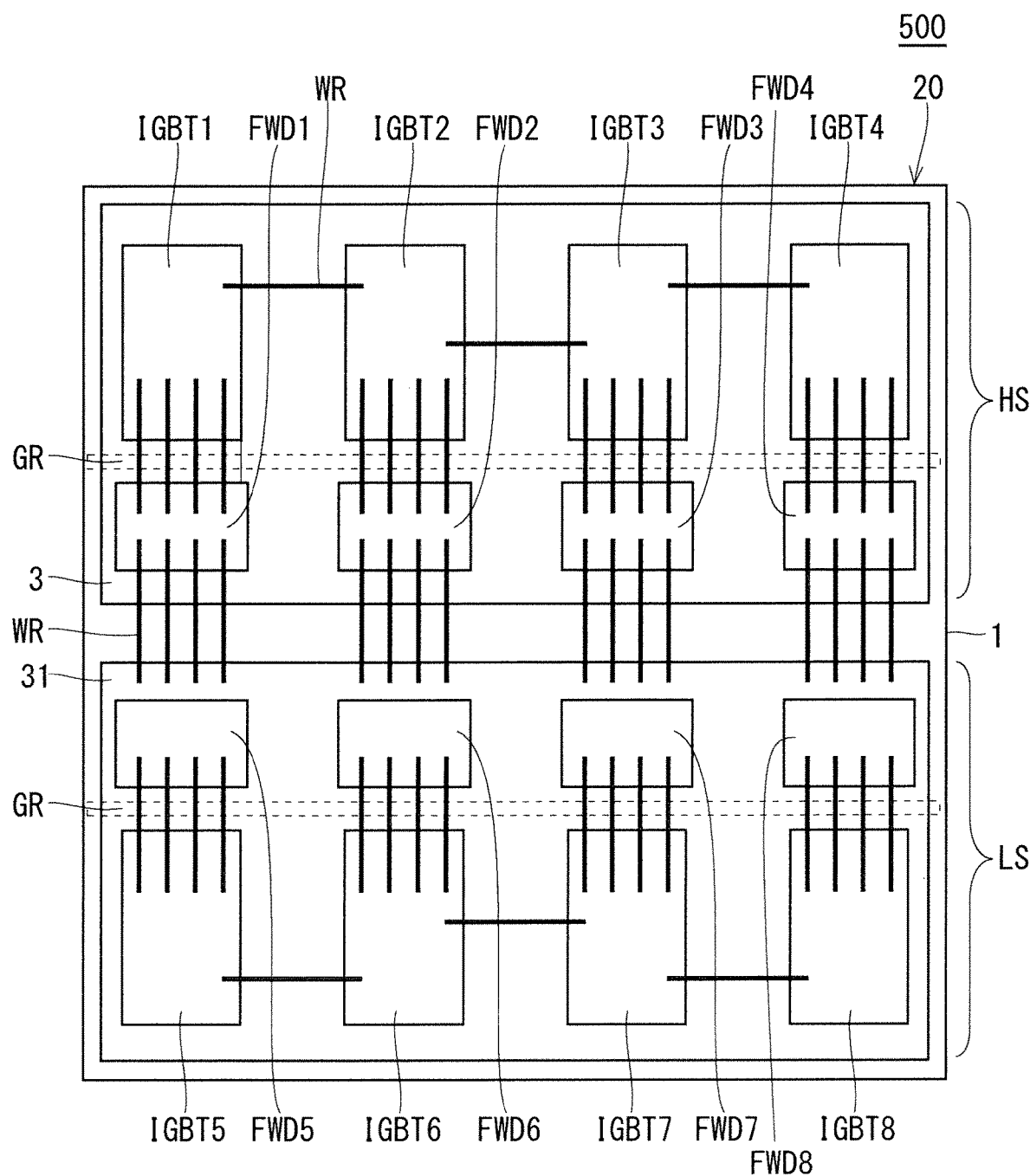
FIG. 8 is a plan view of a semiconductor module according to Embodiment 5 as viewed from the upper surface side.

FIG. 8 is a plan view of a semiconductor module 500 according to Embodiment 5 as viewed from the upper surface side, that is, the side on which semiconductor chips are arranged. In Embodiment 5, characteristics thereof lie in the arrangement of the grooves GR and the grooves GR are illustrated by broken lines, and the illustration of the recess portions RP is omitted.

In the semiconductor module 500 illustrated in FIG. 8, the groove GR is provided in a region corresponding to below the region between the arrangement of the IGBTs 1 to 4 and the arrangement of the FWDs 1 to 4 mounted on the circuit pattern 3 of the high-side phase HS of the heat radiating plate 1, along the arrangement of the IGBTs 1 to 4 and the FWDs 1 to 4. Similarly, the groove GR is provided in a region corresponding to below the region between the arrangement of the IGBTs 5 to 8 and the arrangement of the FWDs 5 to 8 mounted on the circuit pattern 31 of the low-side phase LS of the heat radiating plate 1, along the arrangement of the IGBTs 5 to 8 and the FWDs 5 to 8.

In the semiconductor module 500, among the chip pairs of the IGBT chips and the FWD chips in actual use, the temperature of the IGBT chips tends to be the highest because the IGBT chips consume a large amount of power and generate a large amount of heat. Therefore, by providing the grooves GR, thermal interference from semiconductor chips other than the IGBT chips such as the FWD chips can be alleviated, and the maximum temperature of the entire semiconductor module 500 can be reduced. It should be noted that the IGBT chips are referred to as first semiconductor chips, and the FWD chips whose power consumption is smaller than that of the IGBT chips are referred to as second semiconductor chips.

Embodiment 6

Figure 9:
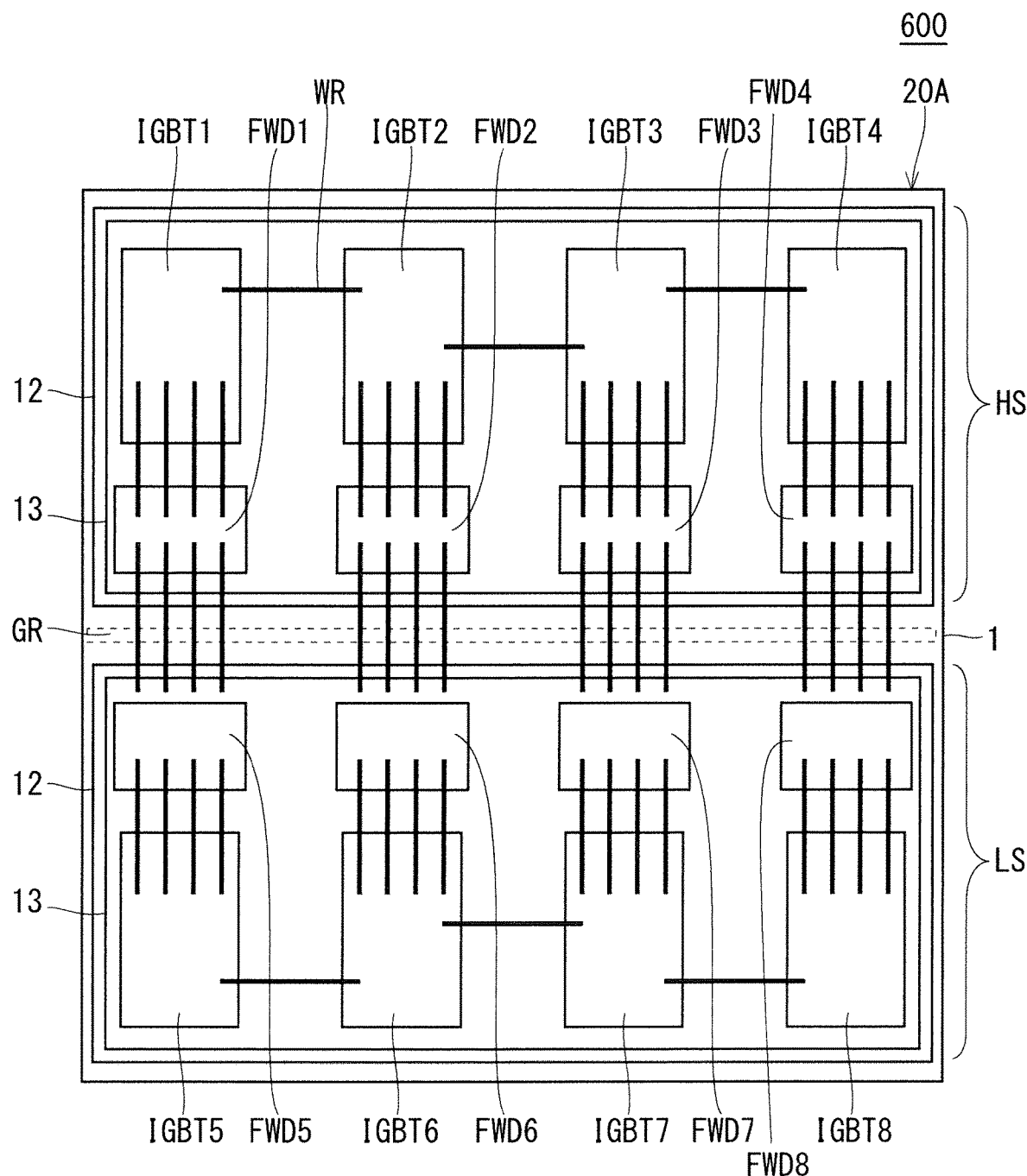
FIG. 9 is a plan view of a semiconductor module according to Embodiment 6 as viewed from the upper surface side.

FIG. 9 is a plan view of a semiconductor module 600 according to Embodiment 6 as viewed from the upper surface side, that is, the side on which semiconductor chips are arranged. In Embodiment 6, characteristics thereof lie in the arrangement of the groove GR and the groove GR is illustrated by broken lines, and the illustration of the recess portions RP is omitted.

The semiconductor module 600 illustrated in FIG. 9 uses different insulating substrates 12 for the high-side phase HS and the low-side phase LS, and a groove GR is provided in a region corresponding to below the region between the insulating substrate 12 for the high-side phase HS and the insulating substrate 12 for the low-side phase LS of the heat radiating plate 1, along the long sides of the insulating substrates 12.

The insulating substrates 12 have ceramic substrates 15 as described with reference to FIG. 2, whose heat radiation property is not well, however, by using different insulating substrates 12 for the high-side phase HS and low-side phase LS, and by providing the groove GR, thermal interference from one of the complementarily heat generating chip pairs of the high-side phase HS or the chip pairs of the low-side phase LS to the other phase is suppressed, and the number of the semiconductor chips to have the maximum temperature is reduced, thereby reducing the temperature difference in the semiconductor module 600. This reduces thermal stress and makes pumping out less likely to occur, the thermal grease TG is less replenished from the recess portions RP, making the thermal grease TG in the recess portions RP less likely to be depleted, thereby extending the time during which the thermal grease TG can be replenished from the recess portions RP.

Embodiment 7

Figure 10:
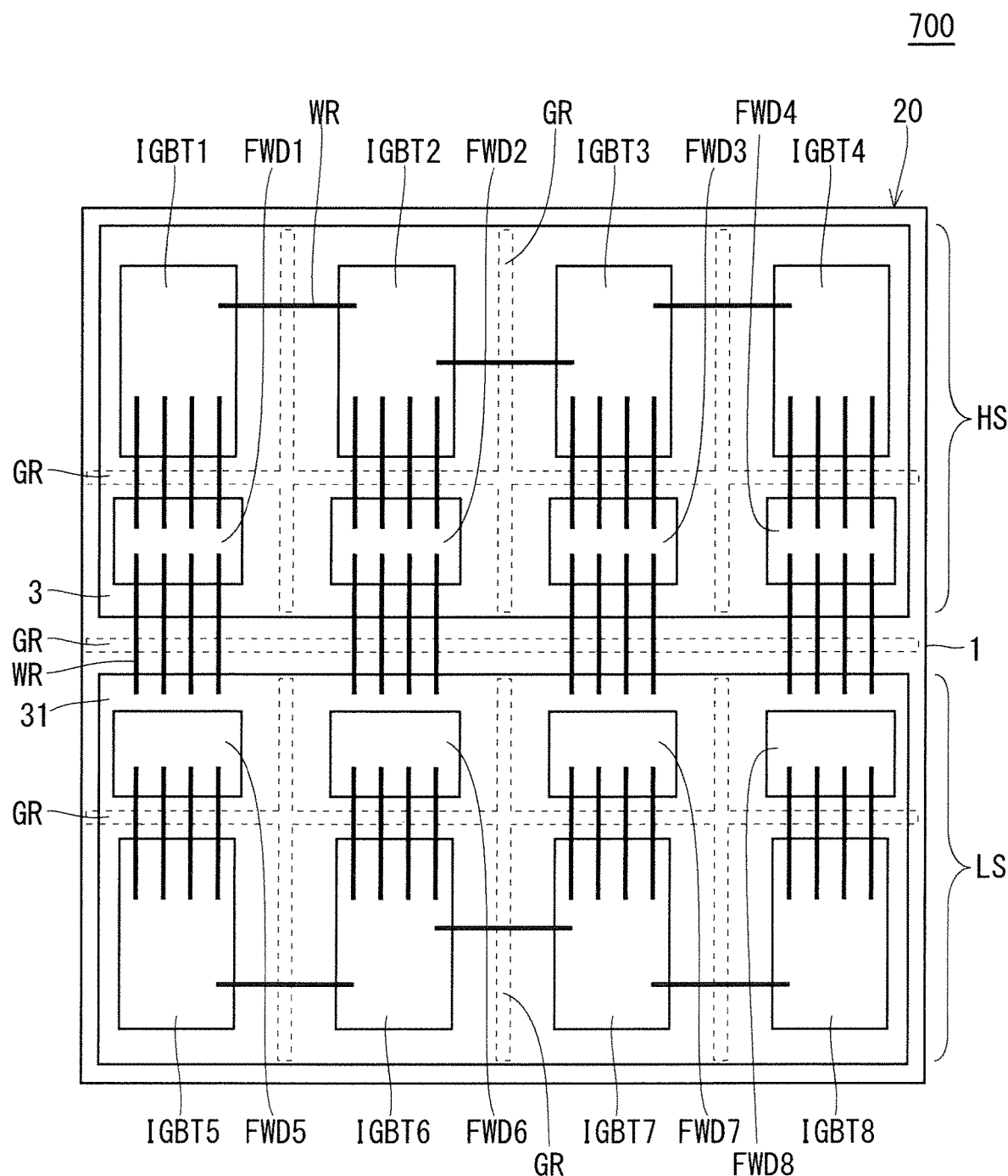
FIG. 10 is a plan view of a semiconductor module according to Embodiment 7 as viewed from the upper surface side.

FIG. 10 is a plan view of a semiconductor module 700 according to Embodiment 7 as viewed from the upper surface side, that is, the side on which semiconductor chips are arranged. In Embodiment 7, characteristics thereof lie in the arrangement of the grooves GR and the grooves GR are illustrated by broken lines, and the illustration of the recess portions RP is omitted.

In the semiconductor module 700 illustrated in FIG. 10, the grooves GR are provided in the high-side phase HS and the low-side phase LS in the regions corresponding to below the regions between the pairs of the IGBT chips and the FWD chips of the heat radiating plate 1, and a groove GR is provided along the long sides of the circuit patterns 3 and 31 in the region corresponding to below the region between the circuit pattern 3 of the high-side phase HS and the circuit pattern 31 of the low-side phase LS of the heat radiating plate 1. Further, a groove GR is provided in a region corresponding to below the region between the arrangement of the IGBTs 1 to 4 and the arrangement of the FWDs 1 to 4 mounted on the circuit pattern 3 of the high side phase HS of the heat radiating plate 1, along the arrangement of the IGBTs 1 to 4 and the FWDs 1 to 4, and a groove GR is provided in a region corresponding to below the region between the arrangement of the IGBTs 5 to 8 and the arrangement of the FWDs 5 to 8 mounted on the circuit pattern 31 of the low-side phase LS of the heat radiating plate 1, along the arrangement of the IGBTs 5 to 8 and the FWDs 5 to 8.

By providing a plurality of grooves GR extending in the horizontal direction and the vertical direction in plan view in this manner, the IGBTs 1 to 8 and the FWDs 1 to 8 arranged in a matrix can be thermally separated individually, alleviating thermal interference between individual semiconductor chips. Therefore, the maximum temperature of the entire semiconductor module 700 can be significantly reduced.

Application Example of Semiconductor Chip

As a semiconductor chip 5, a Metal Oxide Semiconductor Field Effect Transistor (MOSFET) and a Schottky Barrier Diode (SBD) can also be used. Further, as the semiconductor chip 5, in addition to a silicon semiconductor, a wide bandgap semiconductor having a wider bandgap than Si such as SiC (silicon carbide) can also be used. Compared to a silicon device, a SiC device using SiC has excellent withstand voltage property, high allowable current density, and high heat resistance, so the operation thereof at high temperatures is performable. Further, the application example is not limited to SiC, and other wide bandgap semiconductors such as gallium nitride (GaN) may also be used.

In the present disclosure, Embodiments can be combined, appropriately modified or omitted, without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module comprising:
   a plurality of semiconductor chips;
   a module substrate on which the plurality of semiconductor chips are mounted;
   a heat sink on which the module substrate is mounted; and
   a filler filled between the module substrate and the heat sink, wherein
   the module substrate includes
      a heat radiating plate, and an insulating substrate provided on the heat radiating plate and on which the plurality of semiconductor chips are mounted, the heat radiating plate has a plurality of recess portions provided on a surface facing the heat sink and at least one groove, the plurality of recess portions are provided in regions corresponding to below arrangement regions of the plurality of semiconductor chips, the at least one groove is provided in a region corresponding to below a region between at least one of the plurality of semiconductor chips and an adjacent other semiconductor chip, and the filler also is filled in the plurality of recess portions.

2. The semiconductor module according to claim 1, wherein
a depth of the at least one groove is formed deeper than the depth of the plurality of recess portions.

3. The semiconductor module according to claim 1, wherein
a cross-sectional shape of each of the plurality of recess portions is dome-shaped.

4. The semiconductor module according to claim 1, wherein
the plurality of semiconductor chips are arranged in parallel and simultaneously driven, and
the at least one groove is provided below a region between the plurality of semiconductor chips of the heat radiating plate.

5. The semiconductor module according to claim 1, wherein
the plurality of semiconductor chips has
a first chip group arranged in parallel and simultaneously driven, and
a second chip group arranged in parallel and simultaneously driven,
the first chip group and the second chip group are complementarily driven, and
the at least one groove is provided below a region between an arrangement of the first chip group and an arrangement of the second chip group of the heat radiating plate.

6. The semiconductor module according to claim 1, wherein
the plurality of semiconductor chips include first semiconductor chips connected in parallel and arranged adjacent to one another and second semiconductor chips having smaller consumption power than that of the first semiconductor chips, and
the at least one groove is provided in a region below a region between the first semiconductor chips and the second semiconductor chips of the heat radiating plate.

7. The semiconductor module according to claim 1, wherein
the insulating substrate includes a plurality of ceramic substrates, and
the at least one groove is provided in a region below between the plurality of ceramic substrates of the heat radiating plate.

8. The semiconductor module according to claim 1, wherein
the plurality of semiconductor chips are arranged in a matrix, and
the at least one groove is provided below a region between the plurality of semiconductor chips of the heat radiating plate.

* * * * *